United States Patent
Lim et al.

(10) Patent No.: US 10,930,597 B2
(45) Date of Patent: Feb. 23, 2021

(54) DIE SCREENING USING INLINE DEFECT INFORMATION

(71) Applicant: KLA-TENCOR CORPORATION, Milpitas, CA (US)

(72) Inventors: Alex Teng Song Lim, Singapore (SG); Ganesh Meenakshisundaram, Austin, TX (US)

(73) Assignee: KLA-Tencor Corporation, Milpitas, CA (US)

( * ) Notice: Subject to any disclaimer, the term of this patent is extended or adjusted under 35 U.S.C. 154(b) by 70 days.

(21) Appl. No.: 16/439,465

(22) Filed: Jun. 12, 2019

(65) Prior Publication Data

US 2020/0312778 A1 Oct. 1, 2020

Related U.S. Application Data

(60) Provisional application No. 62/824,900, filed on Mar. 27, 2019.

(51) Int. Cl.
*G06K 9/00* (2006.01)
*H01L 23/544* (2006.01)
(Continued)

(52) U.S. Cl.
CPC ....... *H01L 23/544* (2013.01); *G01N 21/9501* (2013.01); *G06T 7/0008* (2013.01);
(Continued)

(58) Field of Classification Search
CPC ....... H01L 22/12; H01L 22/00; H01L 23/544; H01L 21/67282; H01L 21/67288;
(Continued)

(56) References Cited

U.S. PATENT DOCUMENTS

| 7,415,387 B2 | 8/2008 | Fields et al. |
| 2006/0136086 A1 | 6/2006 | Chiang |

(Continued)

FOREIGN PATENT DOCUMENTS

| JP | 2004096121 A | 3/2004 |
| WO | 2019046428 A1 | 3/2019 |

OTHER PUBLICATIONS

WIPO, ISR for PCT/US2020/024804, Jul. 17, 2020.

*Primary Examiner* — Duy M Dang
(74) *Attorney, Agent, or Firm* — Hodgson Russ LLP

(57) ABSTRACT

Embodiments herein include methods, systems, and apparatuses for die screening using inline defect information. Such embodiments may include receiving a plurality of defects, receiving wafersort electrical data for a plurality of dies, classifying each of the defects as a defect-of-interest or nuisance, determining a defect-of-interest confidence for each of the defects-of-interest, determining a die return index for each of the dies containing at least one of the defects-of-interest, determining a die return index cutline, and generating an inking map. Each of the defects may be associated with a die in the plurality of dies. Each of the dies may be tagged as passing a wafersort electrical test or failing the wafersort electrical test. Classifying each of the defects as a defect-of-interest or nuisance may be accomplished using a defect classification model, which may include machine learning. The inking map may be electronically communicated to an inking system.

20 Claims, 9 Drawing Sheets

(51) Int. Cl.
*H01L 21/67* (2006.01)
*G06T 7/00* (2017.01)
*G01N 21/95* (2006.01)

(52) U.S. Cl.
CPC .. *H01L 21/67282* (2013.01); *H01L 21/67288* (2013.01); *G06T 2207/20081* (2013.01); *G06T 2207/30148* (2013.01); *H01L 2223/5444* (2013.01)

(58) Field of Classification Search
CPC ........ H01L 2223/5444; G01N 21/9501; G01N 21/9503; G01N 21/9505; G03F 1/38; G03F 1/42; G03F 1/44; G06T 7/70; G06T 2207/30148; G06T 7/0008; G06T 7/0004; G06T 7/0006; G06T 2207/20081; G06T 2207/20084; G06T 2207/30141; G06T 2207/30108; G06T 2207/30164; G06K 9/40; G06K 9/48; B23Q 17/2452; B23Q 17/2457; B23Q 17/2471; B23Q 17/249; G05B 2219/31432; G05B 2219/36251; G05B 2219/37555; G05B 2219/37578; G05B 2219/50064

See application file for complete search history.

(56) References Cited

U.S. PATENT DOCUMENTS

| | | |
|---|---|---|
| 2008/0172189 A1* | 7/2008 | Kadosh .................. H01L 22/10 |
| | | 702/58 |
| 2010/0297785 A1 | 11/2010 | Guenter-Zimmer et al. |
| 2012/0207382 A1* | 8/2012 | Maeda ............... G06K 9/00557 |
| | | 382/149 |
| 2018/0366357 A1* | 12/2018 | Liao ....................... G06T 7/0004 |
| 2019/0295908 A1* | 9/2019 | Rathert .................. H01L 22/12 |

* cited by examiner

DIE SCREENING USING INLINE DEFECT INFORMATION

CROSS REFERENCE TO RELATED APPLICATIONS

This application claims priority to U.S. Provisional Application No. 62/824,900, filed on Mar. 27, 2019, the entire disclosure of which is hereby incorporated by reference.

FIELD OF THE DISCLOSURE

The disclosure generally relates to wafer inspection. More particularly the disclosure generally relates to reduction of overkill in wafer inspection.

BACKGROUND OF THE DISCLOSURE

In the semiconductor industry, current methods exist for screening out dies at high risk of having killer defects. Such methods are important, as they assist in preventing dies with killer defect from going from manufacturing to the next step in the supply chain. However, such existing methods must balance efficiency with effectiveness, and as such, there is room for improvement. Most suppliers seek to improve their supplier quality index, with an industry goal of zero defects. To do so, the early failure rate (EFR) of dies can be reduced.

Killer defects may cause a malfunction or failure of the semiconductor device, whereas non-killer defects do not substantially affect the performance of the semiconductor device. For example, killer defects may be a) of sub-micron size, b) short elements of a single mask level (such as metal or gate-stack runners) together, or create opens at these same levels, and c) can be detected using in-line inspection tools such as an inspection SEM.

Some systems exist to reduce early failure rate of dies. Currently, some fab and fabless shops use methods like part average testing (PAT). In PAT, the concept is to identify high-risk dies (dies within spec but which are statistically different from the normal population of the other dies). Geographical PAT (G-PAT) is an improvement on PAT, which judges the suitability of a die based on its geographical proximity other failed dies. G-PAT has a variant, good-die bad-neighborhood, which adds the experiential understanding that defects tend to congregate. Parametric PAT (P-PAT) involves defining critical electrical test parameters, and outliers from normal distributions are considered suspect to be eliminated.

Some shops may use a defect's size from inline inspection as the criteria to determine whether a die should be screened out.

In many shops, an inking process is used to demarcate screened-out dies. In such a process, a wafer map that designates which dies to screen out ("ink out") is sent to an inking system. The inking system places a visible ink mark on the dies that are to be screened out. In this way, these "inked-out" dies can be removed from the manufacturing process, as they are considered to be failed dies. A manufacturer can thus not spend further time, energy, and resources on dies it considers to have failed or likely to fail prematurely.

However, these systems use only electrical data with minimal defect information. This usually results in overkill, i.e., screening out dies that are good and pass an electrical test, may not fail in the field, and may not fail under excessive burn in a stress test. Overkill results in lost revenue, and degradation of the semiconductor supplier reliability index, measured in parts per million (ppm), of the fab shop.

There is also an unknown factor based on the test coverage of the aforementioned test schemes. Their coverage is typically only 60-80% of the full functionality of the dies. This is evidence of large gaps in the information used to screen out a die.

Therefore, improved systems for screening out dies for inking are needed.

SUMMARY OF THE DISCLOSURE

The following is a simplified summary providing an initial understanding of the invention. The summary does not necessarily identify key elements nor limits the scope of the invention, but merely serves as an introduction to the following description.

A method is provided in a first embodiment. The method may comprise receiving a plurality of defects, receiving wafersort electrical data for a plurality of dies, classifying each of the defects as a defect-of-interest or nuisance, determining a defect-of-interest confidence for each of the defects-of-interest, determining a die return index for each of the dies containing at least one of the defects-of-interest, determining a die return index cutline, and generating an inking map.

A system is provided in a second embodiment. The system may comprise an inspection tool, an electronic data storage unit, and a processor.

The inspection tool may include a particle emitter, a stage, and a detector. The particle emitter may be configured to emit particles, e.g., photons or electrons, in a particle beam. The stage may be configured to hold a wafer in a path of the particle beam emitted by the particle emitter. The detector may be configured to detect a portion of the particles reflected by the wafer and may yield a wafer image having a plurality of dies.

The electronic data storage unit may be configured to store a recipe. The recipe may include a defect classification model.

The processor may be in electronic communication with the inspection tool and the electronic data storage unit. The processor may be configured to, for the wafer, receive a plurality of defects, receive wafersort electrical data for a plurality of dies, classify each of the defects as a defect-of-interest or nuisance, determine a defect-of-interest confidence for each of the defects-of-interest, determine a die return index for each of the dies containing at least one of the defects-of-interest, determine a die return index cutline, and generate an inking map.

A non-transitory computer-readable storage medium is provided in a third embodiment. The non-transitory computer-readable storage medium may comprise one or more programs for executing steps on one or more computing devices. The steps may include receiving a plurality of defects, receiving wafersort electrical data for a plurality of dies, classifying each of the defects as a defect-of-interest or nuisance, determining a defect-of-interest confidence for each of the defects-of-interest, determining a die return index for each of the dies containing at least one of the defects-of-interest, determining a die return index cutline, and generating an inking map.

In embodiments, each of the defects may be associated with a die in the plurality of dies. Each of the dies may be tagged as passing a wafersort electrical test or failing the wafersort electrical test. Classifying each of the defects as a defect-of-interest or nuisance may be accomplished using a defect classification model. There may be a plurality of defects classified as defects-of-interest.

The inking map may represent a wafer having a high-risk failed die. The high-risk failed die may be a die having a die return index that exceeds the die return index cutline, and the high-risk failed die may be tagged as failing the wafersort electrical test. The inking map may compose an electronic file, which may be configured to be input into a die inking system. The electronic file may be an SINF file.

An overkill may be further provided. The overkill may be a ratio of a quantity of high-risk failed dies to a quantity of dies tagged as passing the wafersort electrical test. In some embodiments, a processor may provide the overkill. In some other embodiments, the one or more programs may provide the overkill.

The defect classification model may be a machine learning model. The machine learning model may be constructed using Random Forest or XGBoost.

The die return index may comprise a sum of the defect-of-interest confidences of each of the defects contained on the given die. This may be for each of the dies containing at least one of the defects-of-interest.

The die return index cutline may comprise the geometric mean of the die return indices.

The electronic file may be further sent electronically to a die inking system. In some embodiments, the electronic file may be further sent electronically by the processor to a die inking system in electronic communication with the processor.

BRIEF DESCRIPTION OF THE FIGURES

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein include methods, systems, and apparatuses for screening dies using inline defect information with machine learning. Such embodiments and/or the implementations thereof may provide advantages in wafer inspection processes. With such embodiments, more defect information may be available for a high-risk die, which can enable a user to make a more informed decision as to whether to screen out the die. The additional defect information may include, inter alia, defect class, defect images, and defect attributes.

Additionally, embodiments of the present disclosure may reduce the overkill of dies. As discussed herein, overkill is the inking out of more dies than necessary when it is revealed that dies on a wafer failed a wafersort electrical test. Using previous methods, such as G-PAT, dies around a cluster of dies that failed wafersort would be inked out unnecessarily, resulting in overkill. Other previous methods result in significant overkill as well, as they rely on incomplete information data sets.

Information obtained may provide for lower costs and decrease overkill. In this way, nearly all wafers can be inspected, i.e., the sampling rate can be increased drastically, at all critical steps.

Such embodiments can solve the problem of bad dies making it through the production process by identifying dies with a higher probability of EFR. They may utilize inline defect information to provide more context, from an inline defect perspective, as to the condition of the die and its history. This may allow users to make a more informed decision as to whether or not to screen out a given die.

Figure 1A:
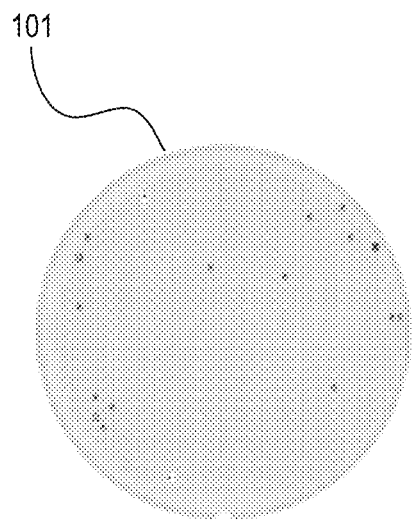
FIG. 1A illustrates a first bin sort wafer map.
Figure 1B:
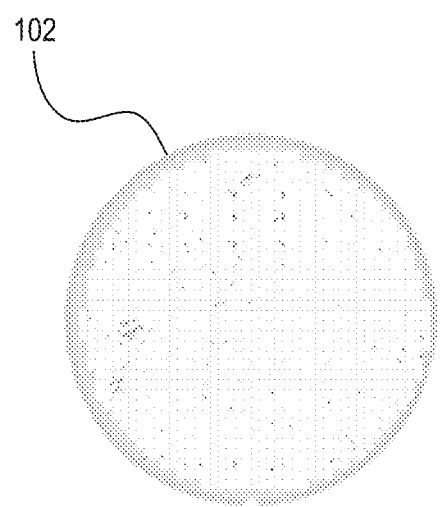
FIG. 1B illustrates a first stacked defect wafer map.
Figure 1C:
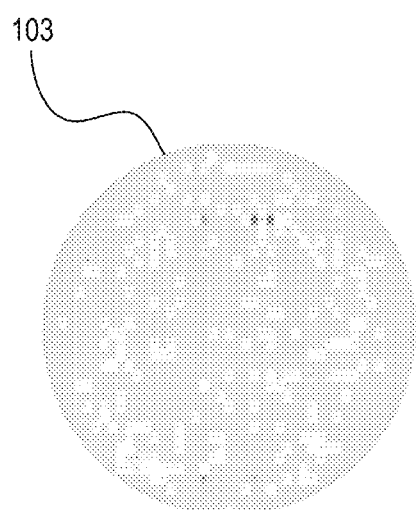
FIG. 1C illustrates a first defect-of-interest confidence wafer map.
Figure 1D:
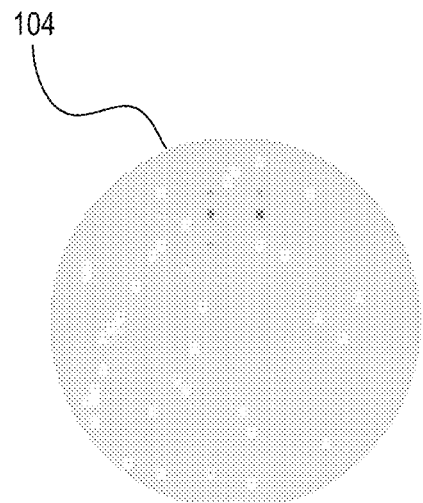
FIG. 1D illustrates a first defect-of-interest confidence outlier wafer map.

In an instance, FIGS. 1A-1D illustrate a series of wafer maps observable in an inspection process for a first example wafer. FIG. 1A illustrates a bin sort wafer map 101. Bin sort wafer map 101 may be a representation of a wafer, with the details of each die thereon. This result comes from wafersort testing after the wafer has completed fabrication and can be tested whether it is functional. FIG. 1B illustrates a stacked defect wafer map 102. Stacked defect wafer map 102 is similar to bin sort wafer map 101, but it contains all defect layers stacked on it, and visible. This is the result of inline defect inspection from defect inspectors. FIG. 1C illustrates defect-of-interest (DOI) confidence wafer map 103, which displays all dies containing DOIs with confidence summed up. In one way, DOI confidence wafer map 103 is similar to a heat map. This is the result generated by computing the defects results using a machine learning model, returning a DOI confidence result for each defect. FIG. 1D illustrates a DOI confidence outlier dies wafer map 104, which displays the dies remaining after filtering outlier dies having higher DOI confidence.

Figure 2A:
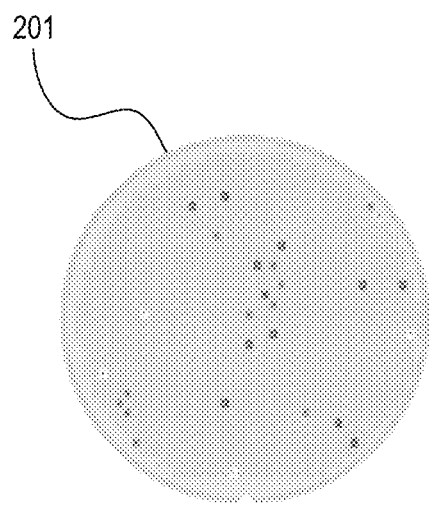
FIG. 2A illustrates a second bin sort wafer map.
Figure 2B:
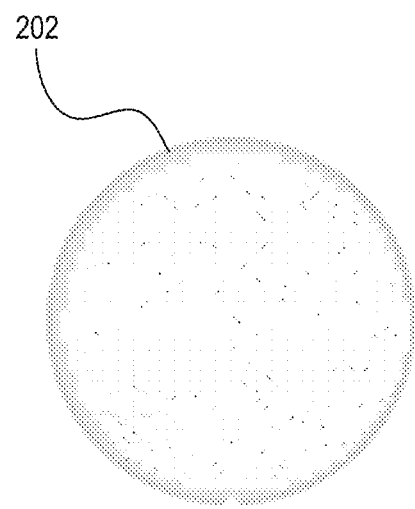
FIG. 2B illustrates a second stacked defect wafer map.
Figure 2C:
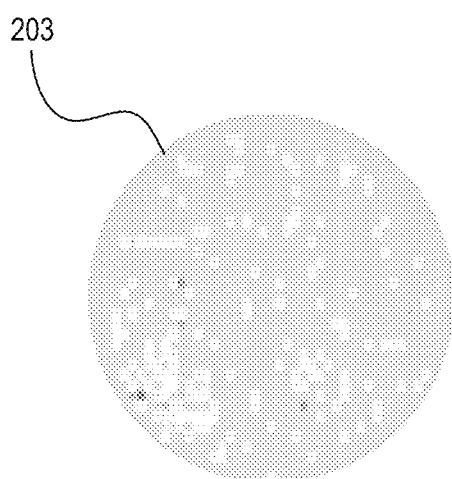
FIG. 2C illustrates a second defect-of-interest confidence wafer map.
Figure 2D:
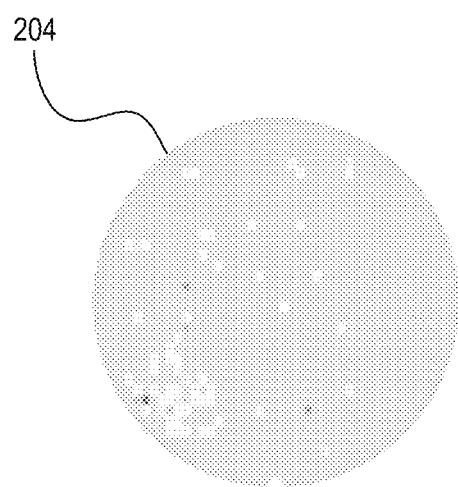
FIG. 2D illustrates a second defect-of-interest confidence outlier wafer map.

In another instance FIGS. 2A-2D illustrate a series of wafer maps observable in an inspection process for a second example wafer. In this way, FIG. 2A illustrates for the second example wafer a bin sort wafer map 201, which is similar to bin sort wafer map 101. FIG. 2B illustrates for the second example wafer a stacked defect wafer map 202, which is similar to stacked defect wafer map 102. FIG. 2C illustrates for the second example wafer a DOI confidence wafer map 203, which is similar to DOI confidence wafer map 103. FIG. 2D illustrates for the second example wafer a DOI confidence outlier dies wafer map 204, which is similar to DOI confidence outlier dies wafer map 104.

Figure 3A:
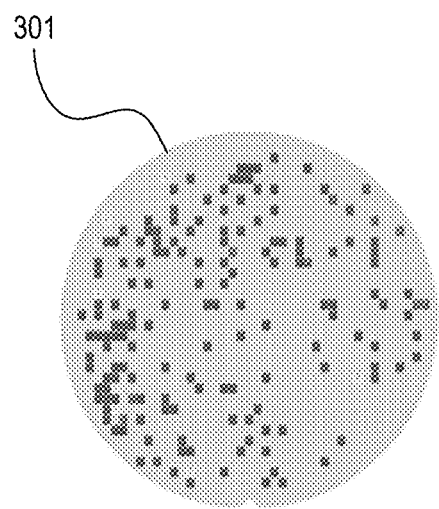
FIG. 3A illustrates an unfiltered inking map.
Figure 3B:
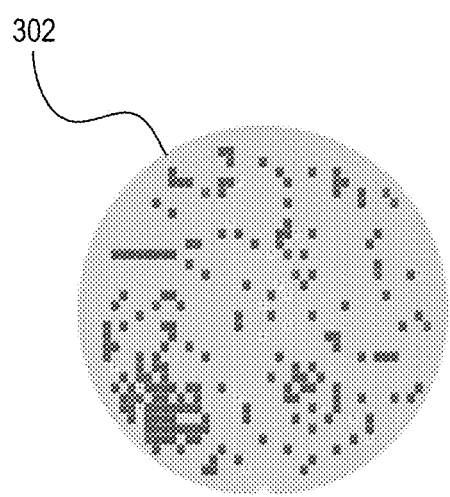
FIG. 3B illustrates an unfiltered inking map.

In some processes, wafer maps such as DOI confidence wafer maps 103 and 203 can be used to produce inking maps, to later determine which dies should be screened out and inked. For example, using such methods, any dies on DOI confidence outlier dies wafer 103 are considered bad and an inking map, such as inking map 301 illustrated in FIG. 3A, is created. Likewise, for example, using such methods, any dies on DOI confidence outlier dies wafer 203 are considered bad and an inking map, such as inking map 302 illustrated in FIG. 3B, is created. Using inking map 301 to ink out dies on the wafer illustrated by stacked defect wafer map 102, or using inking map 302 to ink out dies on the wafer illustrated by stacked defect wafer map 202 can result in overkill.

Embodiments of the present disclosure may involve performing inline defect inspection for all (100%) of the wafers at most of the steps—at minimum, at all critical inspection steps, e.g., after the polysilicon layer is applied. This will provide significant data to train the machine learning models employed herein. Embodiments of the present disclosure assume that there will always be nuisance, which needs to be filtered out and excluded.

Figure 5:
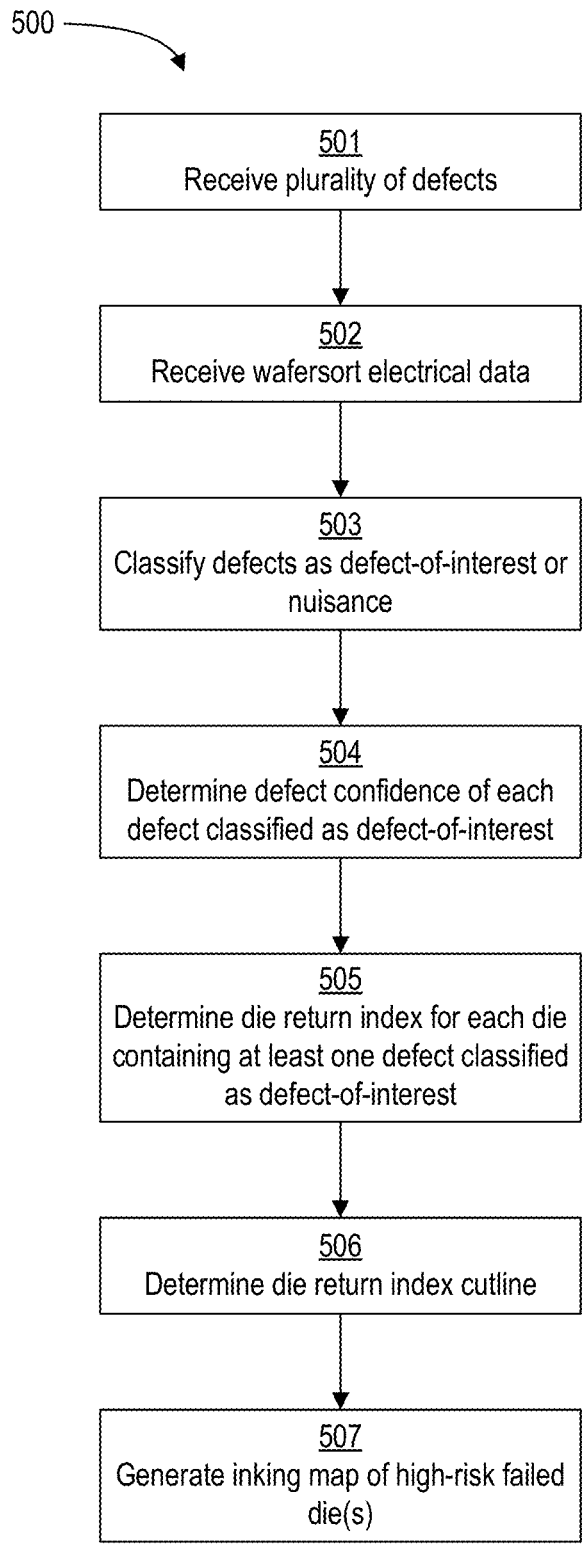
FIG. 5 illustrates a method according to an embodiment of the present disclosure.

The present disclosure may be embodied as a method 500, as depicted in FIG. 5. Method 500 may comprise receiving 501 a plurality of defects. Each defect may be associated with a die in a plurality of dies. Defect data received 501 may include extended user-defined attributes (UDAs). Next may be receiving 502 wafersort electrical data for the plurality of dies. Wafersort electrical data may include a tag or other indication for each die representing whether it has passed a wafersort electrical test or failed a wafersort electrical test. Passing or failing the wafersort electrical test may be judged either by criteria set automatically or by an operator.

This data received 501 and received 502 may be loaded into a database, which can be, for example, a defect database containing UDAs. In some instances, this may be KLA's Klarity database. The defect database may be the source of the die data. After loading, the defects in the defect database may be identified as belonging to a killer defect class, for killer defects, or a nuisance defect class. This identification may be used to generate a machine learning model, which may be a defect classification model.

Afterwards, defects may be classified 503 using a defect classification model as either DOI or nuisance. Defects classified as DOI are desirable for analyzing the condition of the dies according to some embodiments of the present disclosure, and as such, they will be used moving forward. The defect classification model used to classify 503 defects as nuisance or DOI may be a machine learning model. Such a machine learning model may be configured to classify an input defect as DOI or nuisance. Such a machine learning model may be constructed using methods such as, for example, Random Forest or XGBoost.

Random Forest is an "ensemble" method where a large number of trees are created randomly—attributes are selected randomly at each node of every decision tree—and the trees are typically built without pruning until all the bins are pure. The label on each bin is determined by the type of the defects in the training set that land in that bin. All the trees are then used during classification, and each defect obtains a label based on simple voting, if most trees classify a defect as being of, for example, a defect-of-interest, then the defect will be classified as a defect-of-interest.

XGBoost, or extreme gradient boosting, is a gradient boosting implementation. It is an ensemble method used to create strong classifiers based on an iterative combination of weak classifiers. Beginning with only learners that are weak classifiers, the learners are added iteratively, effectively correcting the errors of the previous iteration until an accurate model is reached based on predefined criteria for accuracy.

After classifying 503, a DOI confidence for each defect classified as DOI is determined 504. These DOI confidences may then be used to determine 505 a die return index. A die confidence index may comprise a sum of the DOI confidences of each DOI associated with the die containing at least one defect classified as a DOI.

Figure 6:
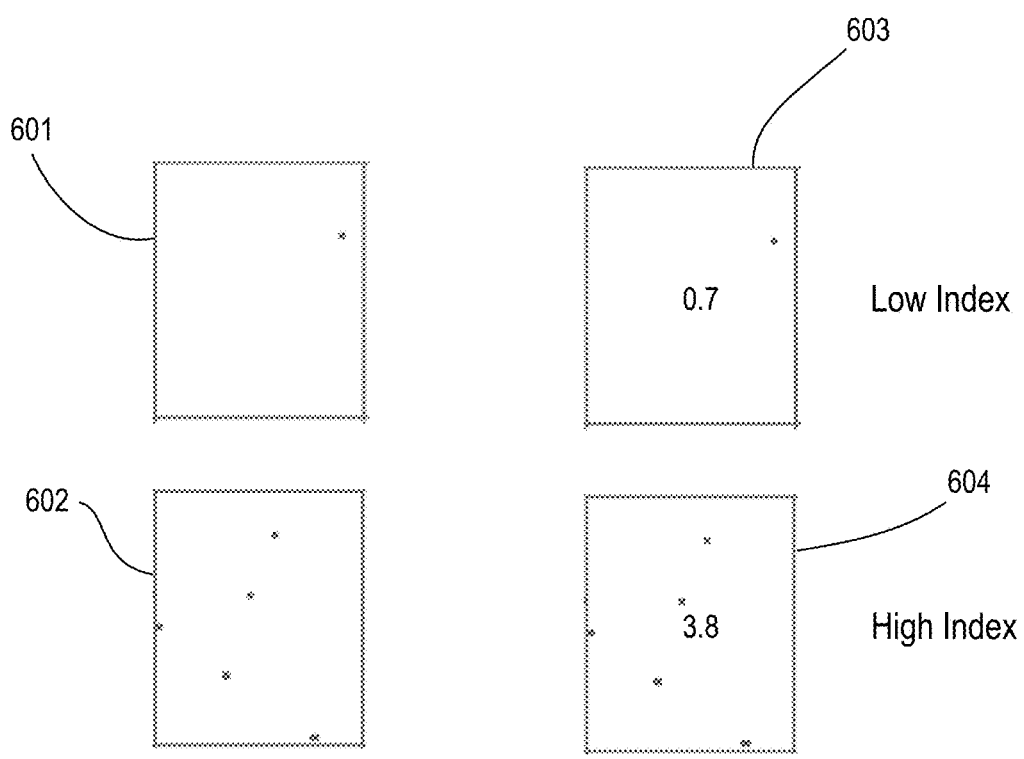
FIG. 6 illustrates a comparison of defect-of-interest confidence sums.

FIG. 6 illustrates an example comparing varying die return indices. A first die, shown as die 601 having one or more defects classified as DOI having DOI confidences. Their sum is represented in die 603 as having a die return index of 0.7. A second die, shown as die 602 having one or more defects classified as DOI having DOI confidences. Their sum is represented in die 604 as having a die return index of 3.8. In this example, die 603, having a die return index of 0.7, could be considered to have a low index and die 604, having a die return index of 3.8, could be considered to have a high index.

Returning to method 500 illustrated in FIG. 5, after die return index is determined 505, a die return index cutline can be determined 506.

Figure 7:
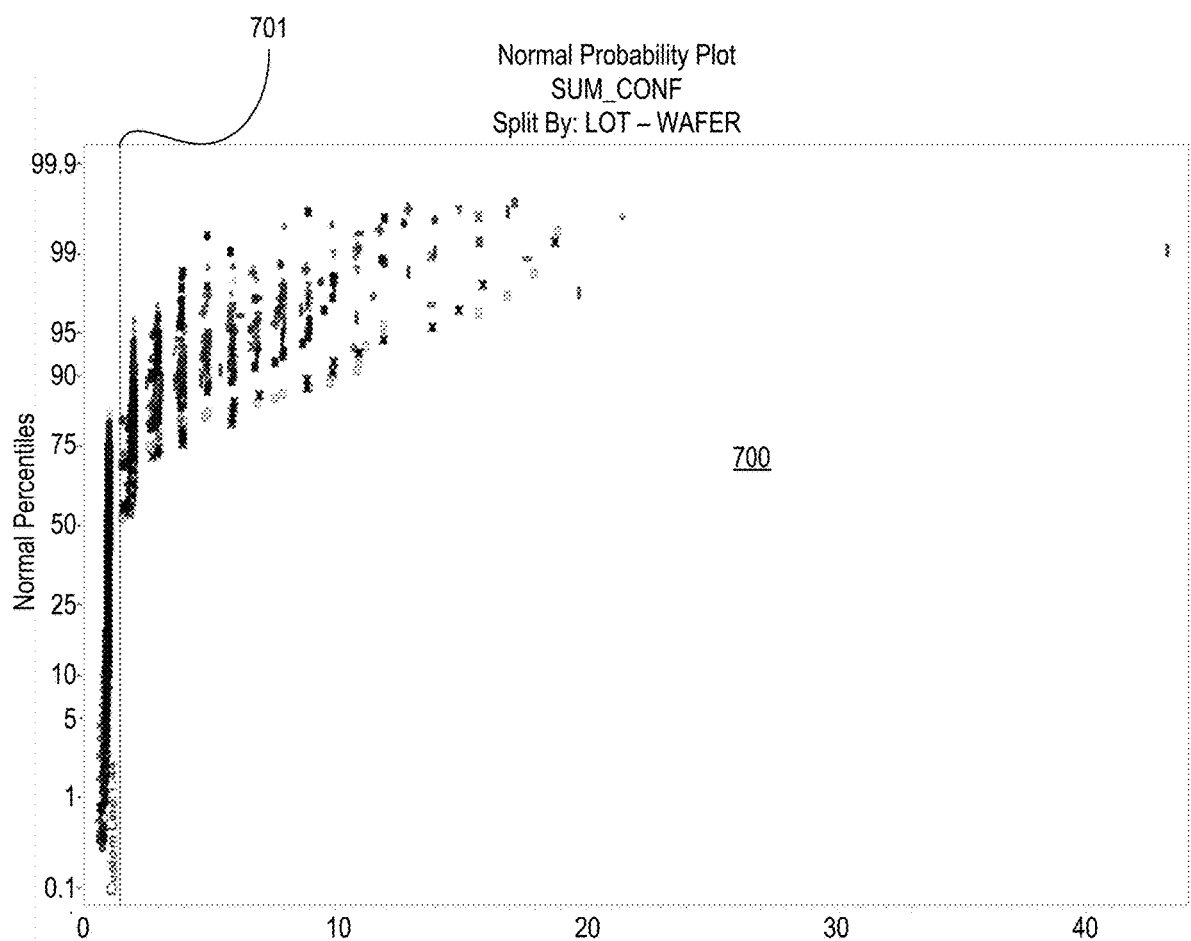
FIG. 7 illustrates a distribution based on die return index as a distribution of the sums of the defect-of-interest confidence for each die.

A die return index cutline may be determined 506, for example, by determining the geometric mean of the die return indices on the wafer or subset of the wafer. For example, a plot 700 of die return indices is shown in FIG. 7. The die return index cutline 701 is determined at the geometric mean of the indices shown.

Returning to method 500 illustrated in FIG. 5, after the die return index cutline is determined 506, an inking map may be generated 507. The inking map generated 507 may include a wafer map file that may represent a wafer. The inking map may have a high-risk failed die, or multiple high-risk failed dies. High-risk failed dies may be dies having die return indices that exceed the die return index cutline, and they may be tagged as failing the wafersort electrical test. In this way, overkill may be attenuated.

A measurement of overkill may also be provided for further reporting or analysis. This measure may be a ratio of a quantity of high-risk failed dies to a quantity of dies tagged as passing the wafersort electrical test. Thus, the difference between the dies screened out using, for example, method 500 and the dies screened out using only the wafersort electrical test, which is overkill, can be determined.

Figure 4A:
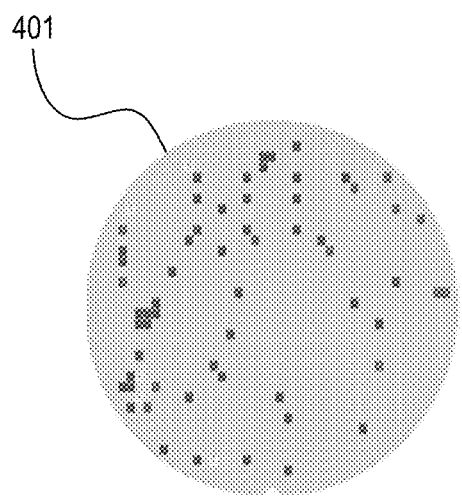
FIG. 4A illustrates a filtered inking map.
Figure 4B:
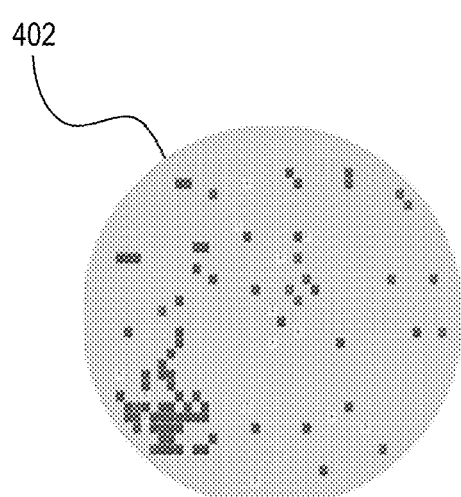
FIG. 4B illustrates a filtered inking map.

The inking map generated 507 may compose an electronic file. Such an electronic file that comprises the inking map may be configured to be input into a die inking system. The electronic file may be an SINF file. An SINF file may be a wafer map format and may be a text-form definition of the relative position of one or more die(s) on a wafer, and may include instructions. In this way, after the inking map is generated, it may be sent to a die inking system. Such inking maps are illustrated in FIG. 4A (inking map 401 is generated using data from method 500 as applied to stacked defect wafer map 102) and FIG. 4B (inking map 402 is generated using data from method 500 as applied to stacked defect wafer map 202).

In an embodiment of the present disclosure, method 500 described herein is implemented on a processor.

In another embodiment of the present disclosure, the above methods are implemented as one or more programs for execution on one or more computing devices. In this embodiment, the one or more programs are stored on a non-transitory computer-readable storage medium. The computer-implemented method may include any step(s) of any method(s) described herein.

Figure 8:
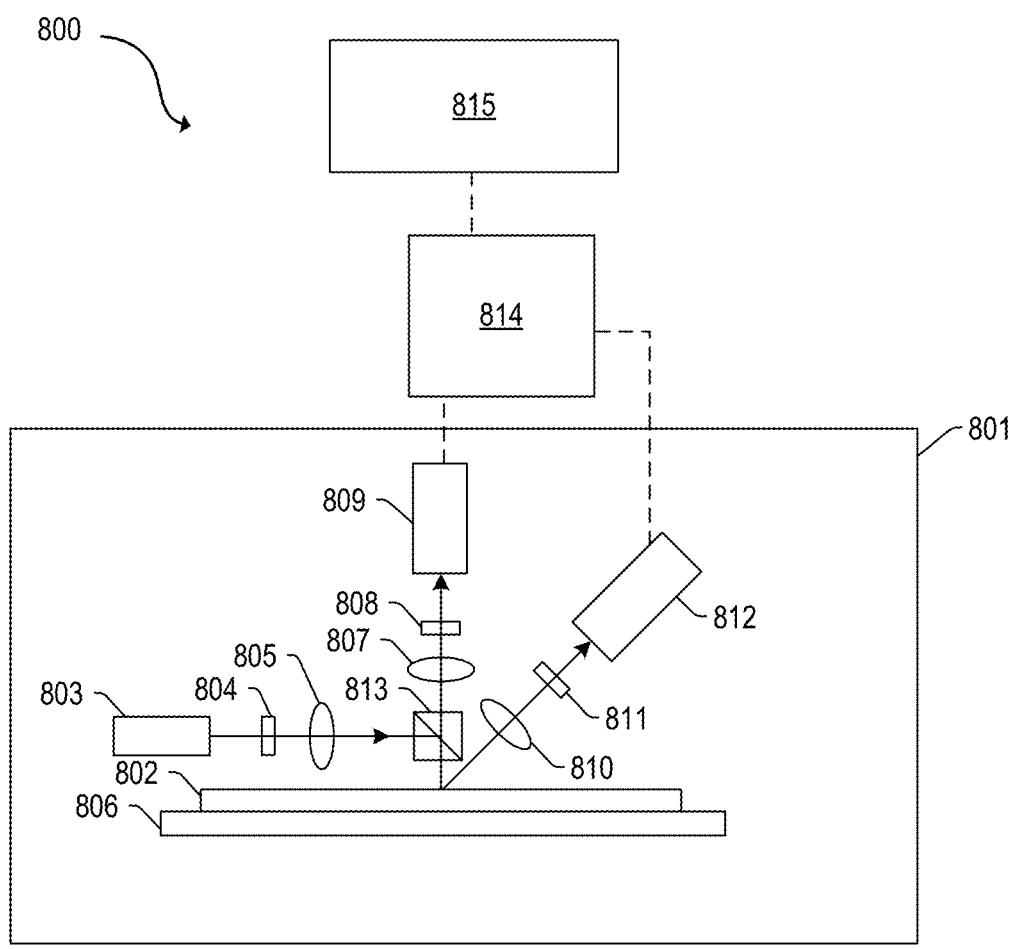
FIG. 8 illustrates a system according to an embodiment of the present disclosure.

One embodiment of a system 800 is shown in FIG. 8. The system 800 includes optical based subsystem 801. In general, the optical based subsystem 801 is configured for generating optical based output for a specimen 802 by directing light to (or scanning light over) and detecting light from the specimen 802. In one embodiment, the specimen 802 includes a wafer. The wafer may include any wafer known in the art. In another embodiment, the specimen includes a reticle. The reticle may include any reticle known in the art.

In the embodiment of the system 800 shown in FIG. 8, optical based subsystem 801 includes an illumination subsystem configured to direct light to specimen 802. The illumination subsystem includes at least one light source (e.g., a particle emitter). For example, as shown in FIG. 8, the illumination subsystem includes light source 803. In one embodiment, the illumination subsystem is configured to direct the light to the specimen 802 at one or more angles of incidence, which may include one or more oblique angles and/or one or more normal angles. For example, as shown in FIG. 8, light from light source 803 is directed through optical element 804 and then lens 805 to specimen 802 at an oblique angle of incidence. The oblique angle of incidence may include any suitable oblique angle of incidence, which may vary depending on, for instance, characteristics of the specimen 802.

The particles emitted from the light source 803, or particle emitter, can be photons. The light source 803, or particle emitter can also emit light, which can be infrared, visible, ultraviolet, or x-ray light.

The optical based subsystem 801 may be configured to direct the light to the specimen 802 at different angles of incidence at different times. For example, the optical based subsystem 801 may be configured to alter one or more characteristics of one or more elements of the illumination subsystem such that the light can be directed to the specimen 802 at an angle of incidence that is different from that shown in FIG. 8. In one such example, the optical based subsystem 801 may be configured to move light source 803, optical element 804, and lens 805 such that the light is directed to the specimen 802 at a different oblique angle of incidence or a normal (or near normal) angle of incidence.

In some instances, the optical based subsystem 801 may be configured to direct light to the specimen 802 at more than one angle of incidence at the same time. For example, the illumination subsystem may include more than one illumination channel, one of the illumination channels may include light source 803, optical element 804, and lens 805 as shown in FIG. 8 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen 802 at different angles of incidence may be different such that light resulting from illumination of the specimen 802 at the different angles of incidence can be discriminated from each other at the detector(s).

In another instance, the illumination subsystem may include only one light source (e.g., light source 803 shown in FIG. 8) and light from the light source may be separated into different optical paths (e.g., based on wavelength, polarization, etc.) by one or more optical elements (not shown) of the illumination subsystem. Light in each of the different optical paths may then be directed to the specimen 802. Multiple illumination channels may be configured to direct light to the specimen 802 at the same time or at different times (e.g., when different illumination channels are used to sequentially illuminate the specimen). In another instance, the same illumination channel may be configured to direct light to the specimen 802 with different characteristics at different times. For example, in some instances, optical element 804 may be configured as a spectral filter and the properties of the spectral filter can be changed in a variety of different ways (e.g., by swapping out the spectral filter) such that different wavelengths of light can be directed to the specimen 802 at different times. The illumination subsystem may have any other suitable configuration known in the art for directing the light having different or the same characteristics to the specimen 802 at different or the same angles of incidence sequentially or simultaneously.

In one embodiment, light source 803 may include a broadband plasma (BBP) source. In this manner, the light generated by the light source 803 and directed to the specimen 802 may include broadband light. However, the light source may include any other suitable light source such as a laser or lamp. The laser may include any suitable laser known in the art and may be configured to generate light at any suitable wavelength or wavelengths known in the art. In addition, the laser may be configured to generate light that is monochromatic or nearly-monochromatic. In this manner, the laser may be a narrowband laser. The light source 803 may also include a polychromatic light source that generates light at multiple discrete wavelengths or wavebands.

Light from optical element 804 may be focused onto specimen 802 by lens 805. Although lens 805 is shown in FIG. 8 as a single refractive optical element, it is to be understood that, in practice, lens 805 may include a number of refractive and/or reflective optical elements that in combination focus the light from the optical element to the specimen. The illumination subsystem shown in FIG. 8 and described herein may include any other suitable optical elements (not shown). Examples of such optical elements include, but are not limited to, polarizing component(s), spectral filter(s), spatial filter(s), reflective optical element(s), apodizer(s), beam splitter(s) (such as beam splitter 813), aperture(s), and the like, which may include any such suitable optical elements known in the art. In addition, the optical based subsystem 801 may be configured to alter one or more of the elements of the illumination subsystem based on the type of illumination to be used for generating the optical based output.

The optical based subsystem 801 may also include a scanning subsystem configured to cause the light to be scanned over the specimen 802. For example, the optical based subsystem 801 may include stage 806 on which specimen 802 is disposed during optical based output generation. The scanning subsystem may include any suitable mechanical and/or robotic assembly (that includes stage 806) that can be configured to move the specimen 802 such that the light can be scanned over the specimen 802. In addition, or alternatively, the optical based subsystem 801 may be configured such that one or more optical elements of the optical based subsystem 801 perform some scanning of the light over the specimen 802. The light may be scanned over the specimen 802 in any suitable fashion such as in a serpentine-like path or in a spiral path.

The optical based subsystem 801 further includes one or more detection channels. At least one of the one or more detection channels includes a detector configured to detect light from the specimen 802 due to illumination of the specimen 802 by the subsystem and to generate output responsive to the detected light. For example, the optical based subsystem 801 shown in FIG. 8 includes two detection channels, one formed by collector 807, element 808, and detector 809 and another formed by collector 810, element 811, and detector 812. As shown in FIG. 8, the two detection channels are configured to collect and detect light at different angles of collection. In some instances, both detection channels are configured to detect scattered light, and the detection channels are configured to detect light that is scattered at different angles from the specimen 802. However, one or more of the detection channels may be configured to detect another type of light from the specimen 802 (e.g., reflected light).

As further shown in FIG. 8, both detection channels are shown positioned in the plane of the paper and the illumination subsystem is also shown positioned in the plane of the paper. Therefore, in this embodiment, both detection channels are positioned in (e.g., centered in) the plane of incidence. However, one or more of the detection channels may be positioned out of the plane of incidence. For example, the detection channel formed by collector 810, element 811, and detector 812 may be configured to collect and detect light that is scattered out of the plane of incidence. Therefore, such a detection channel may be commonly referred to as a "side" channel, and such a side channel may be centered in a plane that is substantially perpendicular to the plane of incidence.

Although FIG. 8 shows an embodiment of the optical based subsystem 801 that includes two detection channels, the optical based subsystem 801 may include a different number of detection channels (e.g., only one detection channel or two or more detection channels). In one such instance, the detection channel formed by collector 810, element 811, and detector 812 may form one side channel as described above, and the optical based subsystem 801 may include an additional detection channel (not shown) formed as another side channel that is positioned on the opposite side of the plane of incidence. Therefore, the optical based subsystem 801 may include the detection channel that includes collector 807, element 808, and detector 809 and that is centered in the plane of incidence and configured to collect and detect light at scattering angle(s) that are at or close to normal to the specimen 802 surface. This detection channel may therefore be commonly referred to as a "top" channel, and the optical based subsystem 801 may also include two or more side channels configured as described above. As such, the optical based subsystem 801 may include at least three channels (i.e., one top channel and two side channels), and each of the at least three channels has its own collector, each of which is configured to collect light at different scattering angles than each of the other collectors.

As described further above, each of the detection channels included in the optical based subsystem 801 may be configured to detect scattered light. Therefore, the optical based subsystem 801 shown in FIG. 8 may be configured for dark field (DF) output generation for specimens 802. However, the optical based subsystem 801 may also or alternatively include detection channel(s) that are configured for bright field (BF) output generation for specimens 802. In other words, the optical based subsystem 801 may include at least one detection channel that is configured to detect light specularly reflected from the specimen 802. Therefore, the optical based subsystems 801 described herein may be configured for only DF, only BF, or both DF and BF imaging. Although each of the collectors are shown in FIG. 8 as single refractive optical elements, it is to be understood that each of the collectors may include one or more refractive optical die(s) and/or one or more reflective optical element(s).

The one or more detection channels may include any suitable detectors known in the art. For example, the detectors may include photo-multiplier tubes (PMTs), charge coupled devices (CCDs), time delay integration (TDI) cameras, and any other suitable detectors known in the art. The detectors may also include non-imaging detectors or imaging detectors. In this manner, if the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the optical based subsystem may be signals or data, but not image signals or image data. In such instances, a processor such as processor 814 may be configured to generate images of the specimen 802 from the non-imaging output of the detectors. However, in other instances, the detectors may be configured as imaging detectors that are configured to generate imaging signals or image data. Therefore, the optical based subsystem may be configured to generate optical images or other optical based output described herein in a number of ways.

It is noted that FIG. 8 is provided herein to generally illustrate a configuration of an optical based subsystem 801 that may be included in the system embodiments described herein or that may generate optical based output that is used by the system embodiments described herein. The optical based subsystem 801 configuration described herein may be altered to optimize the performance of the optical based subsystem 801 as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

Figure 9:
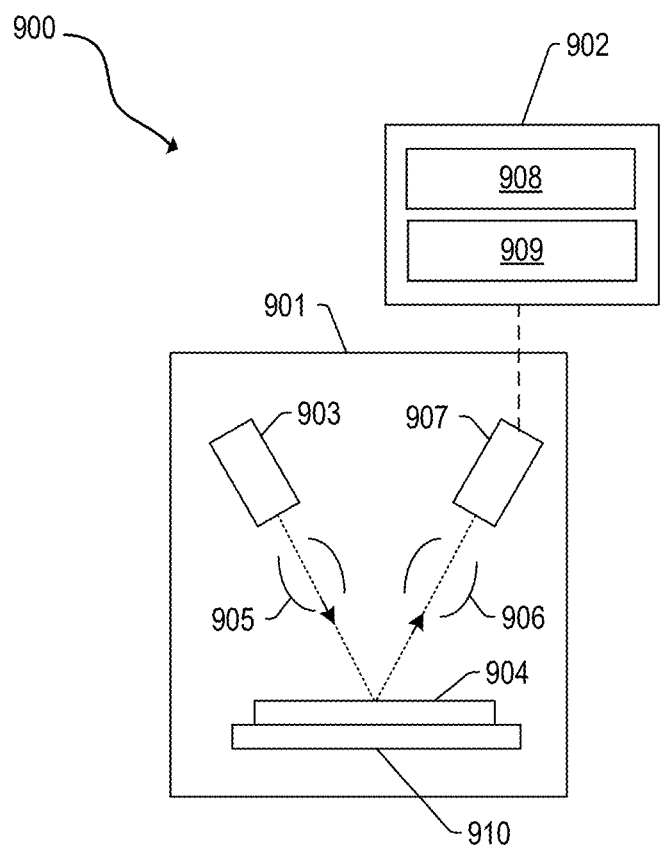
FIG. 9 illustrates a system according to an embodiment of the present disclosure.

FIG. 9 is a block diagram of an embodiment of a system 900. The system 900 includes a wafer inspection tool (which includes the electron column 901) configured to generate images of a specimen 904, which may include a wafer or a reticle.

The wafer inspection tool includes an output acquisition subsystem that includes at least an energy source and a detector. The output acquisition subsystem may be an electron beam-based output acquisition subsystem. For example, in one embodiment, the energy directed to the specimen 904 includes electrons, and the energy detected from the specimen 904 includes electrons. In this manner, the energy source may be an electron beam source. In one such embodiment shown in FIG. 9, the output acquisition subsystem includes electron column 901, which is coupled to computer subsystem 902. A stage 910 may hold the specimen 904.

As also shown in FIG. 9, the electron column 901 includes an electron beam source 903 (e.g., a particle emitter) configured to generate electrons that are focused to specimen 904 by one or more elements 905. The electron beam source 903 may include, for example, a cathode source or emitter tip. The one or more elements 905 may include, for example, a gun lens, an anode, a beam limiting aperture, a gate valve, a beam current selection aperture, an objective lens, and a scanning subsystem, all of which may include any such suitable elements known in the art.

Electrons returned from the specimen 904 (e.g., secondary electrons) may be focused by one or more elements 906 to detector 907. One or more elements 906 may include, for example, a scanning subsystem, which may be the same scanning subsystem included in element(s) 905.

The electron column 901 also may include any other suitable elements known in the art.

Although the electron column 901 is shown in FIG. 9 as being configured such that the electrons are directed to the specimen 904 at an oblique angle of incidence and are scattered from the specimen 904 at another oblique angle, the electron beam may be directed to and scattered from the specimen 904 at any suitable angles. In addition, the electron beam-based output acquisition subsystem may be configured to use multiple modes to generate images of the specimen 904 (e.g., with different illumination angles, collection angles, etc.). The multiple modes of the electron beam-based output acquisition subsystem may be different in any image generation parameters of the output acquisition subsystem.

Computer subsystem 902 may be coupled to detector 907 as described above. The detector 907 may detect electrons returned from the surface of the specimen 904 thereby forming electron beam images of the specimen 904. The electron beam images may include any suitable electron beam images. Computer subsystem 902 may be configured to perform any of the functions described herein using the output of the detector 907 and/or the electron beam images. Computer subsystem 902 may be configured to perform any additional step(s) described herein. A system 900 that includes the output acquisition subsystem shown in FIG. 9 may be further configured as described herein.

It is noted that FIG. 9 is provided herein to generally illustrate a configuration of an electron beam-based output acquisition subsystem that may be used in the embodiments described herein. The electron beam-based output acquisition subsystem configuration described herein may be altered to optimize the performance of the output acquisition subsystem as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

Although the output acquisition subsystem is described above as being an electron beam-based output acquisition subsystem, the output acquisition subsystem may be an ion beam-based output acquisition subsystem. Such an output acquisition subsystem may be configured as shown in FIG. 9 except that the electron beam source may be replaced with any suitable ion beam source known in the art. In addition, the output acquisition subsystem may be any other suitable ion beam-based output acquisition subsystem such as those included in commercially available focused ion beam (FIB) systems, helium ion microscopy (HIM) systems, and secondary ion mass spectroscopy (SIMS) systems.

The computer subsystem 902 includes a processor 908 and an electronic data storage unit 909. The processor 908 may include a microprocessor, a microcontroller, or other devices.

The processor 814 or computer subsystem 902 may be coupled to the components of the system 800 or 900, respectively, in any suitable manner (e.g., via one or more transmission media, which may include wired and/or wireless transmission media) such that the processor 814 or 908, respectively can receive output. The processor 814 or 908 may be configured to perform a number of functions using the output. The system 800 or 900 can receive instructions or other information from the processor 814 or 908, respectively. The processor 814 or 908 and/or the electronic data storage unit 815 or 909, respectively, optionally may be in electronic communication with another wafer inspection tool, a wafer metrology tool, or a wafer review tool (not illustrated) to receive additional information or send instructions. For example, the processor 814 or 908 and/or the electronic data storage unit 815 or 909, respectively, can be in electronic communication with a scanning electron microscope.

The processor 814 or 908, or computer subsystem 902, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 814 or 908 and electronic data storage unit 815 or 909, respectively, may be disposed in or otherwise part of the system 800 or 900, respectively, or another device. In an example, the processor 814 or 908 and electronic data storage unit 815 or 909, respectively may be part of a standalone control unit or in a centralized quality control unit. Multiple processors 814 or 908 or electronic data storage units 815 or 909, respectively, may be used.

The processor 814 or 908 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 814 or 908 to implement various methods and functions may be stored in readable storage media, such as a memory in the electronic data storage unit 815 or 909, respectively, or other memory.

If the system 800 or 900 includes more than one processor 814, or processor 908 or computer subsystem 902, respectively, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 814 or 908 may be configured to perform a number of functions using the output of the system 800 or 900, respectively, or other output. For instance, the processor 814 or 908 may be configured to send the output to an electronic data storage unit 815 or 909, respectively, or another storage medium. The processor 814 or 908 may be further configured as described herein.

The processor 814, processor 908, or computer subsystem 902 may be part of a defect review system, an inspection system, a metrology system, or some other type of system.

Thus, the embodiments disclosed herein describe some configurations that can be tailored in a number of manners for systems having different capabilities that are more or less suitable for different applications.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 814 or 908 may be configured according to any of the embodiments described herein. The processor 814 or 908 also may be configured to perform other functions or additional steps using the output of the system 800 or 900, respectively, or using images or data from other sources.

The processor 814 or 908 may be communicatively coupled to any of the various components or sub-systems of system 800 or 900, respectively, in any manner known in the art. Moreover, the processor 814 or 908 may be configured to receive and/or acquire data or information from other systems (e.g., inspection results from an inspection system such as a review tool, a remote database including design data and the like) by a transmission medium that may include wired and/or wireless portions. In this manner, the transmission medium may serve as a data link between the processor 814 or 908 and other subsystems of the system 800 or 900, respectively, or systems external to system 800 or 900, respectively.

The processor 814 or 908 is in electronic communication with the wafer inspection tool, such as the detector 809 or 812, or detector 907, respectively. The processor 814 or 908 may be configured to process images generated using measurements from the detector 809 or 812, or detector 907, respectively. For example, the processor 814 or 908 may be configured to perform embodiments of the method 500.

An additional embodiment relates to a non-transitory computer-readable medium storing program instructions executable on a controller for performing a computer-implemented method for processing images of the specimen 802 or 904, as disclosed herein. In particular, as shown in FIG. 8 or 9, electronic data storage unit 815 or 909, or other storage medium may contain non-transitory computer-readable medium that includes program instructions executable on the processor 814 or 908, respectively. The computer-implemented method may include any step(s) of any method(s) described herein, including method 500.

Program instructions implementing methods such as those described herein may be stored on computer-readable medium, such as in the electronic data storage unit 815 or 909, or other storage medium. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), Streaming SIMD Extension (SSE), or other technologies or methodologies, as desired.

In an embodiment, processor 814 or processor 908 may be configured to receive a plurality of defects and wafersort electrical data for a plurality of dies. Each defect may be associated with a die in the plurality of dies. Each die may be further tagged as passing or failing a wafersort electrical test. Processor 814 or 908 may be further configured to classify, using a defect classification model, each defect as DOI or nuisance, determine a defect-of-interest confidence for each defect classified as DOI, determine a die return index for each die containing at least one defect classified as a DOI, and determine a die return index cutline.

Processor 814 or 908 may be further configured to then generate an inking map including a wafer map file, representing the wafer, having a high-risk failed die, wherein the high-risk failed die is a die having a die return index that exceeds the die return index cutline and is tagged as failing the wafersort electrical test.

Various steps, functions, and/or operations of system 800 or system 900 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 814 or a single processor 908 (or computer subsystem 902) or, alternatively, multiple processors 814 or multiple processors 908 (or multiple computer subsystems 902). Moreover, different sub-systems of the system 800 or system 900 may include one or more computing or logic systems. Therefore, the above description should not be interpreted as a limitation on the present disclosure but merely an illustration.

The steps of the method described in the various embodiments and examples disclosed herein are sufficient to carry out the methods of the present invention. Thus, in an embodiment, the method consists essentially of a combination of the steps of the methods disclosed herein. In another embodiment, the method consists of such steps.

Although the present disclosure has been described with respect to one or more particular embodiments, it will be understood that other embodiments of the present disclosure may be made without departing from the scope of the present disclosure.

What is claimed is:

1. A method, comprising:
receiving a plurality of defects, each of the defects associated with a die in a plurality of dies;
receiving wafersort electrical data for the plurality of dies, wherein each of the dies is tagged as passing a wafersort electrical test or failing the wafersort electrical test;
classifying, using a defect classification model, each of the defects as a defect-of-interest or a nuisance, wherein there is a plurality of defects-of-interest;
determining a defect-of-interest confidence for each of the defects-of-interest;
determining a die return index for each of the dies containing at least one of the defects-of-interest;
determining a die return index cutline; and
generating an inking map representing a wafer having a high-risk failed die, wherein the high-risk failed die is a die having a die return index that exceeds the die return index cutline and is tagged as failing the wafersort electrical test.

2. The method of claim 1, further comprising providing an overkill, wherein the overkill is a ratio of a quantity of high-risk failed dies to a quantity of dies tagged as passing the wafersort electrical test.

3. The method of claim 1, wherein the defect classification model is a machine learning model constructed using Random Forest or XGBoost.

4. The method of claim 1, wherein the die return index comprises, for each of the dies containing at least one of the defects-of-interest, a sum of the defect-of-interest confidences of each of the defects-of-interest contained thereon.

5. The method of claim 1, wherein the die return index cutline comprises the geometric mean of the die return indices.

6. The method of claim 1, wherein the inking map composes an electronic file configured to be input into a die inking system.

7. The method of claim 6, wherein the electronic file is an SINF file.

8. The method of claim 6, further comprising electronically sending the electronic file to the die inking system.

9. A system, comprising:
an inspection tool including:
a particle emitter configured to emit particles in a particle beam;
a stage configured to hold a wafer in a path of the particle beam emitted by the particle emitter; and
a detector configured to detect a portion of the particles reflected by the wafer and yield a wafer image having a plurality of dies;
an electronic data storage unit configured to store a recipe including a defect classification model; and
a processor in electronic communication with the inspection tool and the electronic data storage unit configured to, for the wafer:
receive a plurality of defects, each of the defects associated with a die in the plurality of dies;
receive wafersort electrical data for the plurality of dies, wherein each of the dies is tagged as passing a wafersort electrical test or failing the wafersort electrical test;
classify, using a defect classification model, each of the defects as a defect-of-interest or a nuisance, wherein there is a plurality of defects-of-interest;
determine a defect-of-interest confidence for each of the defects-of-interest;
determine a die return index for each of the dies containing at least one of the defects-of-interest;
determine a die return index cutline; and
generate an inking map representing the wafer having a high-risk failed die, wherein the high-risk failed die is a die having a die return index that exceeds the die return index cutline and is tagged as failing the wafersort electrical test.

10. The system of claim 9, wherein the processor is further configured to provide an overkill, wherein the overkill is a ratio of a quantity of high-risk failed dies to a quantity of dies tagged as passing the wafersort electrical test.

11. The system of claim 9, wherein the defect classification model is a machine learning model constructed using Random Forest or XGBoost.

12. The system of claim 9, wherein the die return index comprises, for each of the dies containing at least one of the defects-of-interest, a sum of the defect-of-interest confidences of each of the defects-of-interest contained thereon.

13. The system of claim 9, wherein the die return index cutline comprises the geometric mean of the die return indices.

14. The system of claim 9, wherein the inking map composes an electronic file configured to be input into a die inking system.

15. The system of claim 14, wherein the electronic file is an SINF file.

16. The system of claim 14, wherein the processor is further in electronic communication with the die inking system, and wherein the processor is further configured to electronically send the electronic file to the die inking system.

17. A non-transitory computer-readable storage medium, comprising one or more programs for executing the following steps on one or more computing devices:
receive a plurality of defects, each of the defects associated with a die in a plurality of dies;
receive wafersort electrical data for the plurality of dies, wherein each of the dies is tagged as passing a wafersort electrical test or failing the wafersort electrical test;
classify, using a defect classification model, each of the defects as a defect-of-interest or a nuisance, wherein there is a plurality of defects-of-interest;
determine a defect-of-interest confidence for each of the defects-of-interest;
determine a die return index for each of the dies containing at least one of the defects-of-interest;
determine a die return index cutline; and
generate an inking map representing a wafer having a high-risk failed die, wherein the high-risk failed die is a die having a die return index that exceeds the die return index cutline and is tagged as failing the wafersort electrical test.

18. The non-transitory computer-readable storage medium of claim 17, wherein the one or more programs provide an overkill, wherein the overkill is a ratio of a quantity of high-risk failed dies to a quantity of dies tagged as passing the wafersort electrical test.

19. The non-transitory computer-readable storage medium of claim 17, wherein the defect classification model is a machine learning model constructed using Random Forest or XGBoost.

20. The non-transitory computer-readable storage medium of claim 17, wherein the die return index comprises, for each of the dies containing at least one of the defects-of-interest, a sum of the defect-of-interest confidences of each of the defects-of-interest contained thereon.

* * * * *